United States Patent
Chi et al.

(10) Patent No.: US 7,994,040 B2
(45) Date of Patent: Aug. 9, 2011

(54) SEMICONDUCTOR DEVICE AND FABRICATION THEREOF

(75) Inventors: Min-Hwa Chi, Taipei (TW);
Wen-Chuan Chiang, Hsinchu (TW);
Mu-Chi Chiang, Hsinchu (TW);
Chang-Ku Chen, Hsinchu (TW)

(73) Assignee: Taiwan Semiconductor Manufacturing Co., Ltd., Hsin-Chu (TW)

( * ) Notice: Subject to any disclaimer, the term of this patent is extended or adjusted under 35 U.S.C. 154(b) by 556 days.

(21) Appl. No.: 11/785,023

(22) Filed: Apr. 13, 2007

(65) Prior Publication Data
US 2008/0254579 A1 Oct. 16, 2008

(51) Int. Cl.
*H01L 21/4763* (2006.01)

(52) U.S. Cl. ........ 438/595; 438/199; 438/519; 438/527; 257/E21.632; 257/E29.012; 257/E29.278; 257/E21.435

(58) Field of Classification Search .......... 438/199, 438/527, 595, 519; 257/E21.362, E29.012, 257/E29.278, E21.435
See application file for complete search history.

(56) References Cited

U.S. PATENT DOCUMENTS

| | | | | |
|---|---|---|---|---|
| 6,893,967 | B1 * | 5/2005 | Wright et al. | 438/691 |
| 7,018,888 | B2 * | 3/2006 | Goodlin et al. | 438/230 |
| 7,217,626 | B2 * | 5/2007 | Bu et al. | 438/303 |
| 2002/0160592 | A1 * | 10/2002 | Sohn | 438/535 |
| 2008/0182372 | A1 * | 7/2008 | Liu et al. | 438/230 |

* cited by examiner

*Primary Examiner* — Michelle Estrada
(74) *Attorney, Agent, or Firm* — Birch, Stewart, Kolasch & Birch, LLP

(57) ABSTRACT

A method for forming a semiconductor device is disclosed. A substrate including a gate dielectric layer and a gate electrode layer sequentially formed thereon is provided. An offset spacer is formed on sidewalls of the gate dielectric layer and the gate electrode layer. A carbon spacer is formed on a sidewall of the offset spacer, and the carbon spacer is then removed. The substrate is implanted to form a lightly doped region using the gate electrode layer and the offset spacer as a mask. The method may also include providing a substrate having a gate dielectric layer and a gate electrode layer sequentially formed thereon. A liner layer is formed on sidewalls of the gate electrode layer and on the substrate. A carbon spacer is formed on a portion of the liner layer adjacent the sidewall of the gate electrode layer. A main spacer is formed on a sidewall of the carbon spacer. The carbon spacer is removed to form an opening between the liner layer and the main spacer. The opening is sealed by a sealing layer to form an air gap.

9 Claims, 17 Drawing Sheets

SEMICONDUCTOR DEVICE AND FABRICATION THEREOF

BACKGROUND OF THE INVENTION

1. Field of the Invention

The invention relates to a semiconductor device and fabrication thereof, and more particularly to a transistor of a semiconductor device and fabrication thereof.

2. Description of the Related Art

Integrated circuit technology continues to advance at a rapid pace, with many circuit technologies being implemented using semiconductor fabrication processes. Consideration is given to various aspects of the development of semiconductor fabrication processes, including, maximizing efficiency, lowering manufacturing cost, and increasing performance. With these goals in mind, reducing transistor size is a topic of continuing interest. Reduced transistor size enables reduced device size and facilitates improved device performance.

FIGS. 1A-1E show fabrications of a conventional transistor. First, referring to FIG. 1A, a gate dielectric layer 104, a gate electrode layer 106 and a hard mask layer 108 are sequentially formed on a silicon substrate 102. A photoresist layer (not shown) is formed on the hard mask layer 108 and then patterned by lithography to form a photoresist pattern 110. Referring to FIG. 1B, the hard mask layer 108 is patterned using the photoresist pattern 110 as a mask. The gate electrode layer 106 is then patterned using the patterned hard mask layer 108 as a mask. Referring to FIG. 1C, a first spacer 112 is formed on a sidewall of the gate electrode layer 106. Referring to FIG. 1D, the substrate 102 is implanted using the gate electrode layer 108 and the first spacer 112 as a mask to form a lightly doped region 114. Referring to FIG. 1E, a second spacer 118 is formed on a sidewall of the first spacer 112. Next, the substrate 102 is implanted to form a source/drain region 116 using gate electrode layer 108, the first spacer 112 and the second spacer 118 as a mask.

In the conventional technology, the short channel effect (SCE) is among the most challenging design obstacles to be overcome in scaling down critical dimensions of devices. Various forms of SCE include, threshold Voltage (VT) rolloff, drain induced barrier lowering (DIBL), and subthreshold swing variation. Another problem related to SCE is an increase of gate-to-drain overlap capacitance, resulting in slower circuits.

A few of the parameters that can be optimized for reducing SCE are source and drain (S/D) 116 extension junction depth and channel doping. Because the LDD implant region 114, also referred to as the source and drain extension (SDE) implant region, is self-aligned to the edge of gate 106, inserting a first spacer 112 adjacent the gate 106 edge prior to performing an LDD implant can compensate the spacing due to lateral diffusion of dopants and reduce the gate-to-drain overlap capacitance.

As gate lengths become shorter, for example less than about 0.1 microns including less than about 65 nm, the conventional processes with one spacer formation for forming the LDD and S/D doped regions are no longer adequate to precisely position the LDD implant regions 114, thereby leading to increased SCE.

BRIEF SUMMARY OF THE INVENTION

A detailed description is given in the following embodiments with reference to the accompanying drawings. These and other problems are generally solved or circumvented, and technical advantages are generally achieved, by the invention.

The invention provides an improved method for forming CMOS devices to achieve improved device performance and reliability as well as an improved process flow methodology, in addition to overcoming other shortcomings of the conventional technology.

In an embodiment of the invention, a method for forming a semiconductor device is disclosed. A substrate comprising a gate dielectric layer and a gate electrode layer sequentially formed thereon is provided. An offset spacer is formed on sidewalls of the gate dielectric layer and the gate electrode layer. A carbon spacer is formed on a sidewall of the offset spacer, and the carbon spacer is then removed. The substrate is implanted to form a lightly doped region using the gate electrode layer and the offset spacer as a mask.

In another embodiment of the invention, a method for forming a semiconductor device is disclosed. A substrate comprising a sequentially formed gate dielectric layer and a gate electrode layer is provided. A liner layer is formed on sidewalls of the gate electrode layer and on the substrate. A carbon spacer is formed on a portion of the liner layer adjacent the sidewall of the gate electrode layer. A main spacer is formed on a sidewall of the carbon spacer. The carbon spacer is removed to form an opening between the liner layer and the main spacer. A sealing layer seals the opening, forming an air gap.

BRIEF DESCRIPTION OF THE DRAWINGS

The invention can be more fully understood by reading the subsequent detailed description and examples with references made to the accompanying drawings, wherein.

DETAILED DESCRIPTION OF THE INVENTION

FIGS. 2A-2F demonstrate a method known to the inventor of forming a gate structure in a semiconductor fabrication process. This is not prior art for the purpose of determining the patentability of the present invention. This merely shows a problem found by the inventors.

Figure 1A:
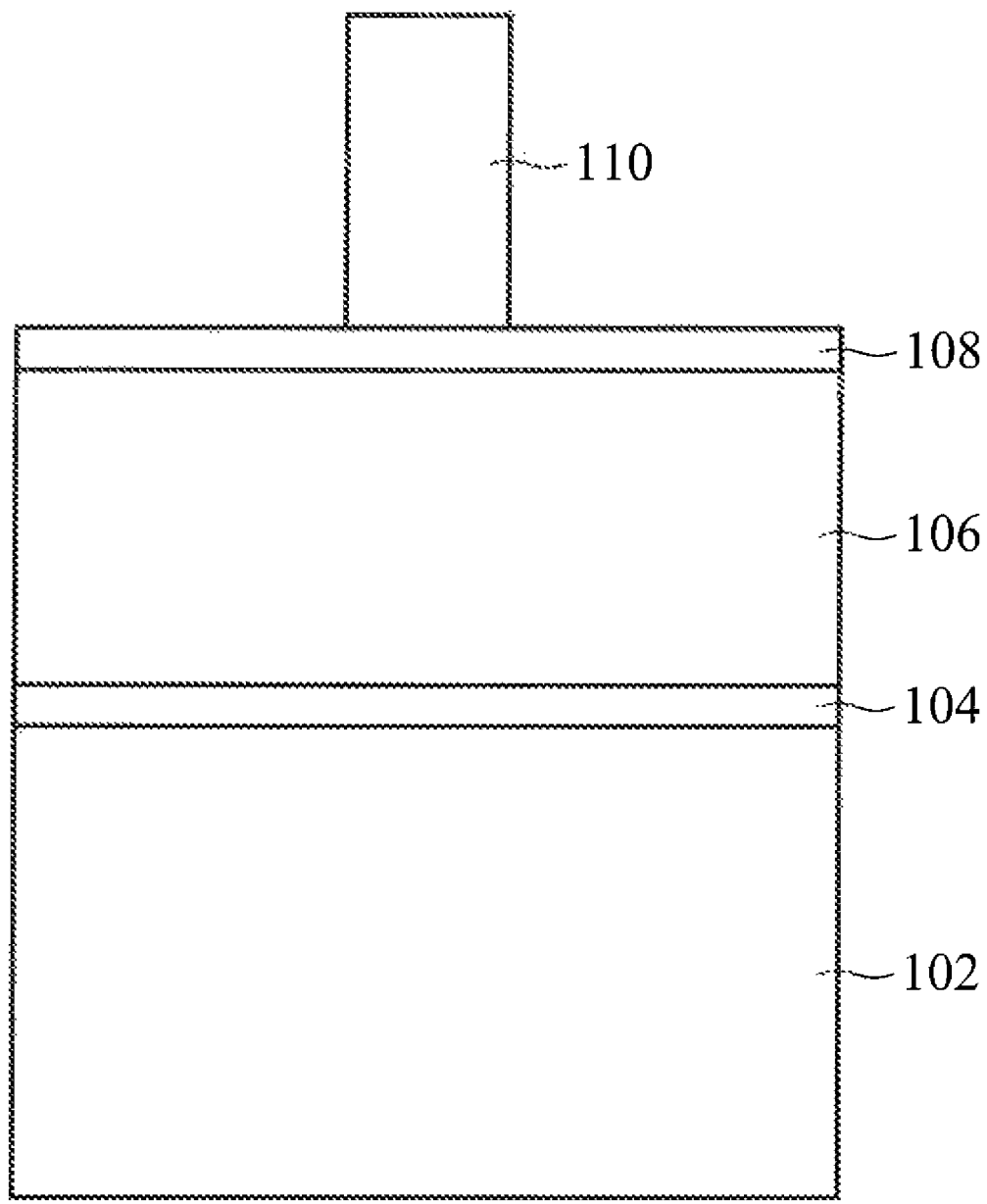
FIGS. 1A-1E show fabrications of a conventional transistor.
Figure 1B:
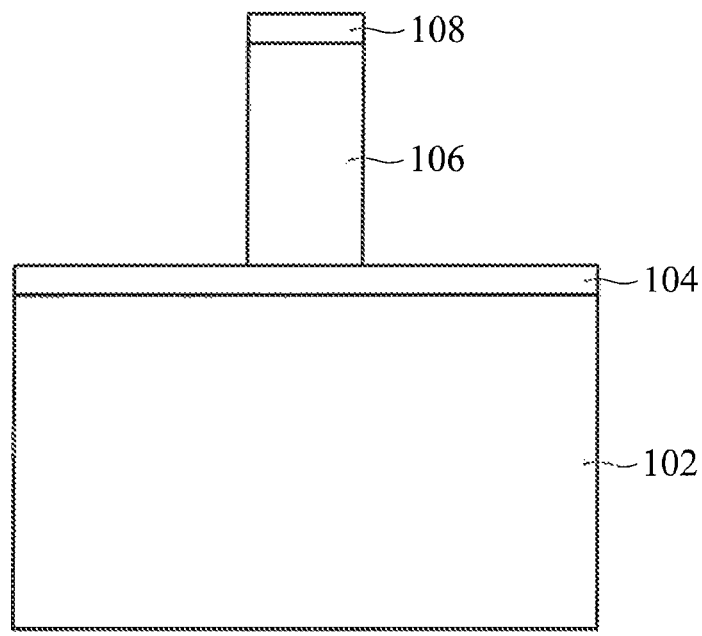
Figure 1C:
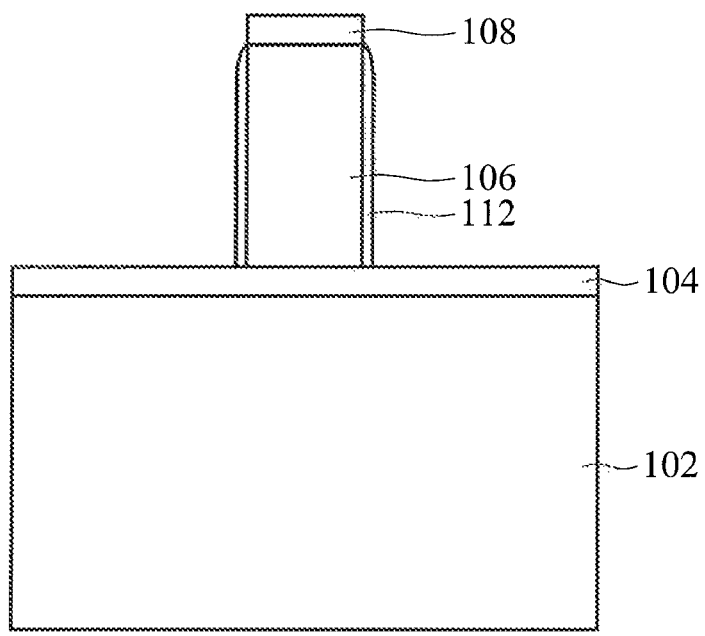
Figure 1D:
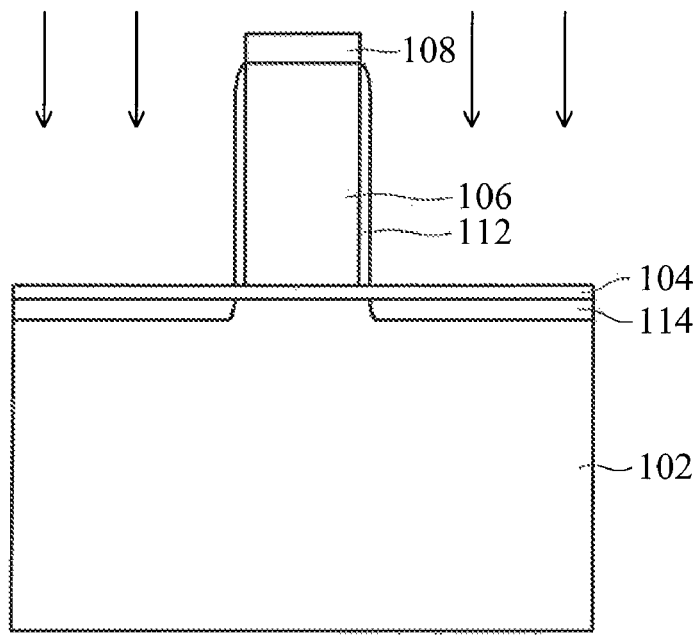
Figure 1E:
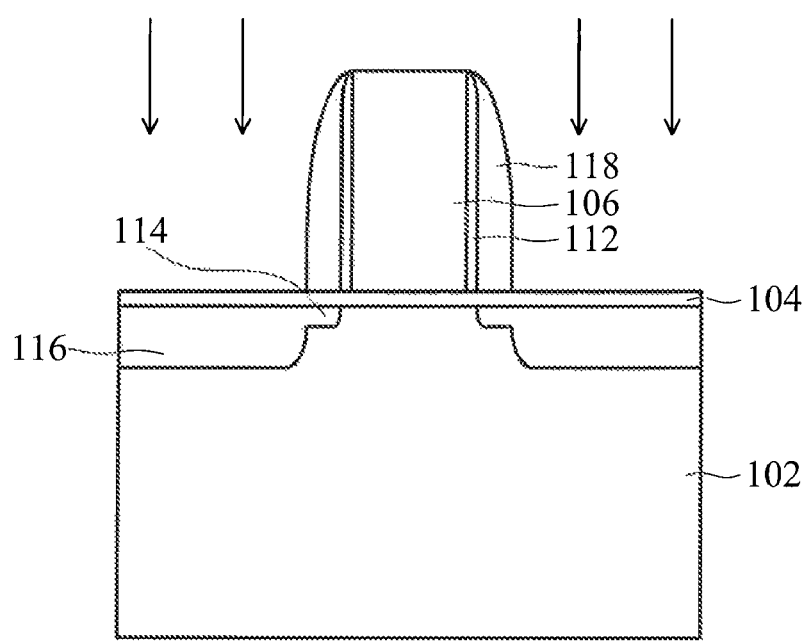
Figure 2A:
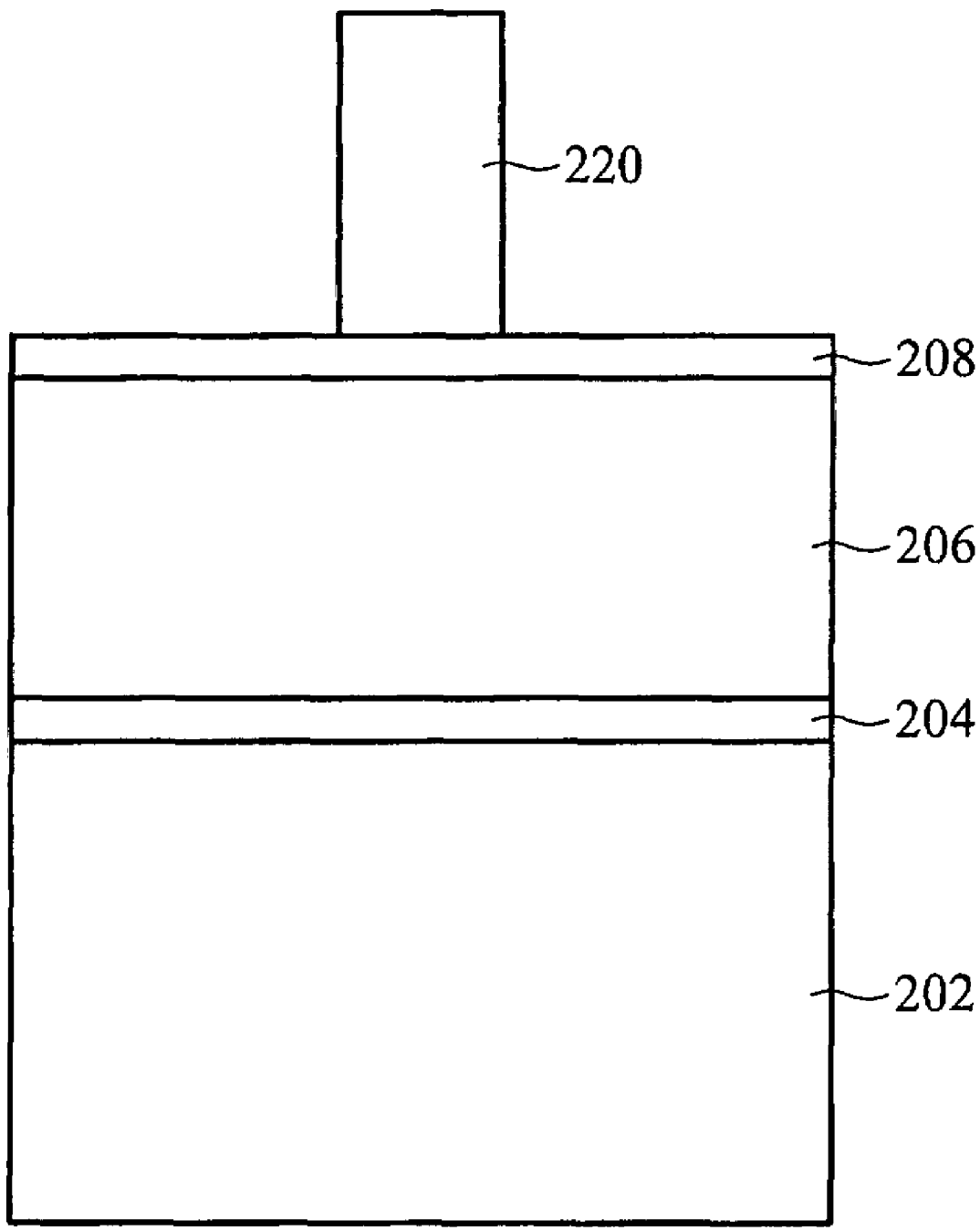
FIGS. 2A-2F demonstrate a method known to the inventor of forming a gate structure in a semiconductor fabrication process.
Figure 2B:
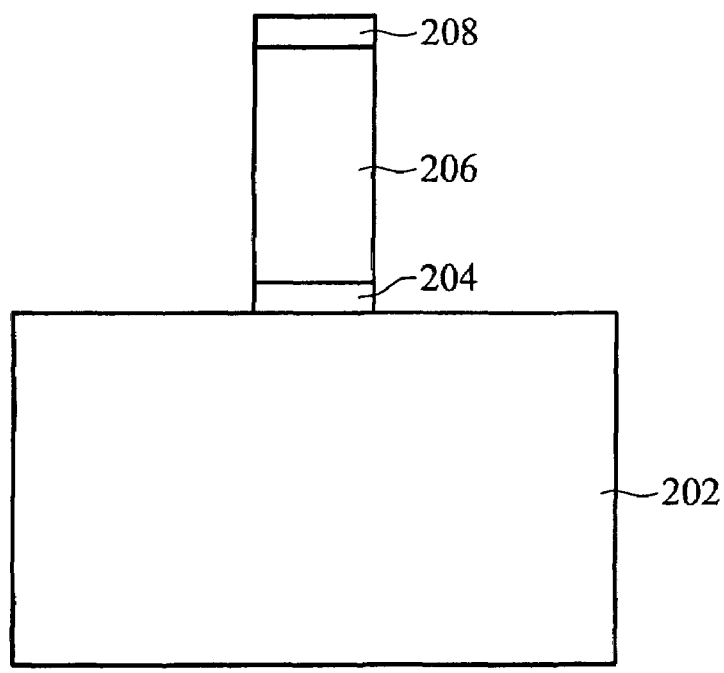
Figure 2C:
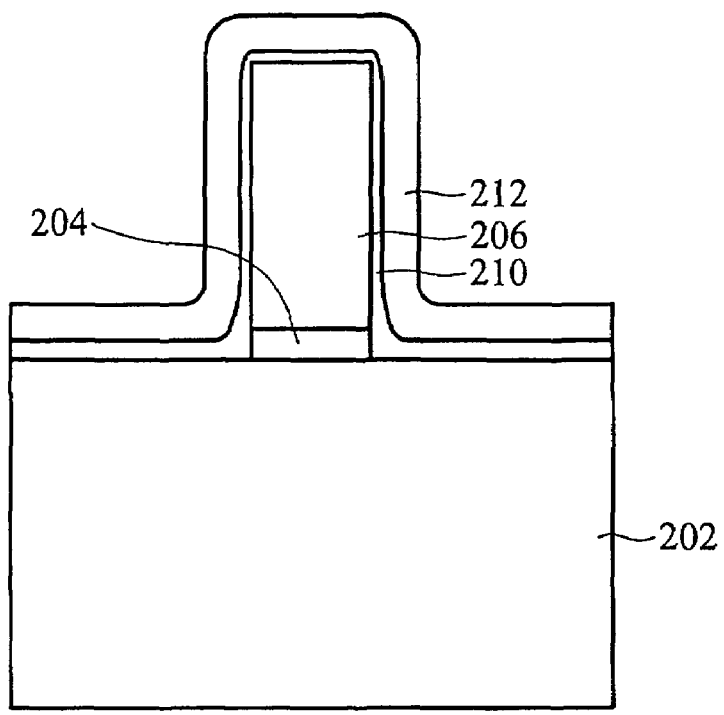
Figure 2D:
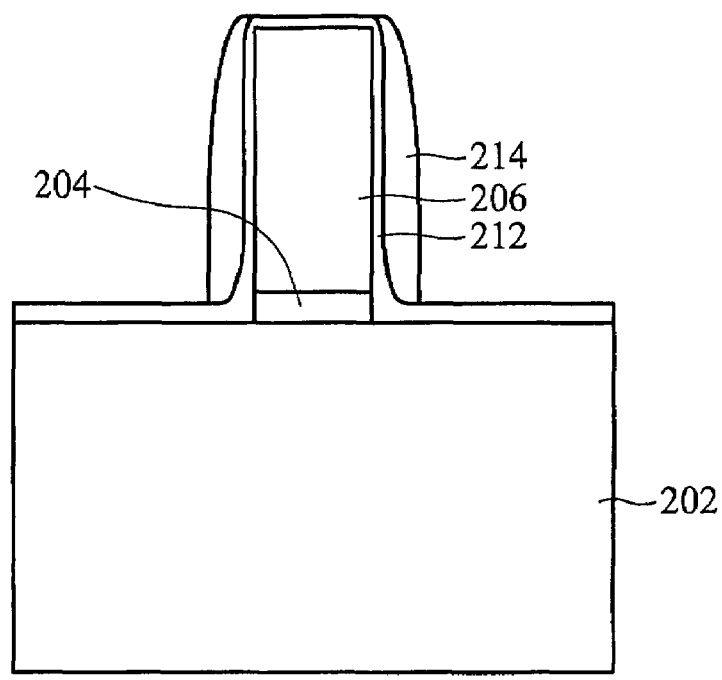
Figure 2E:
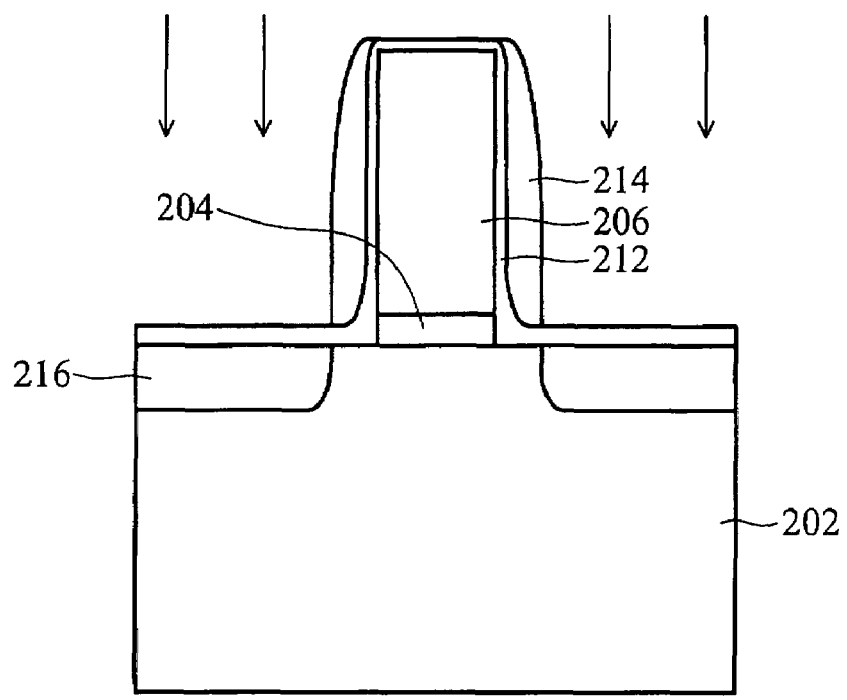
Figure 2F:
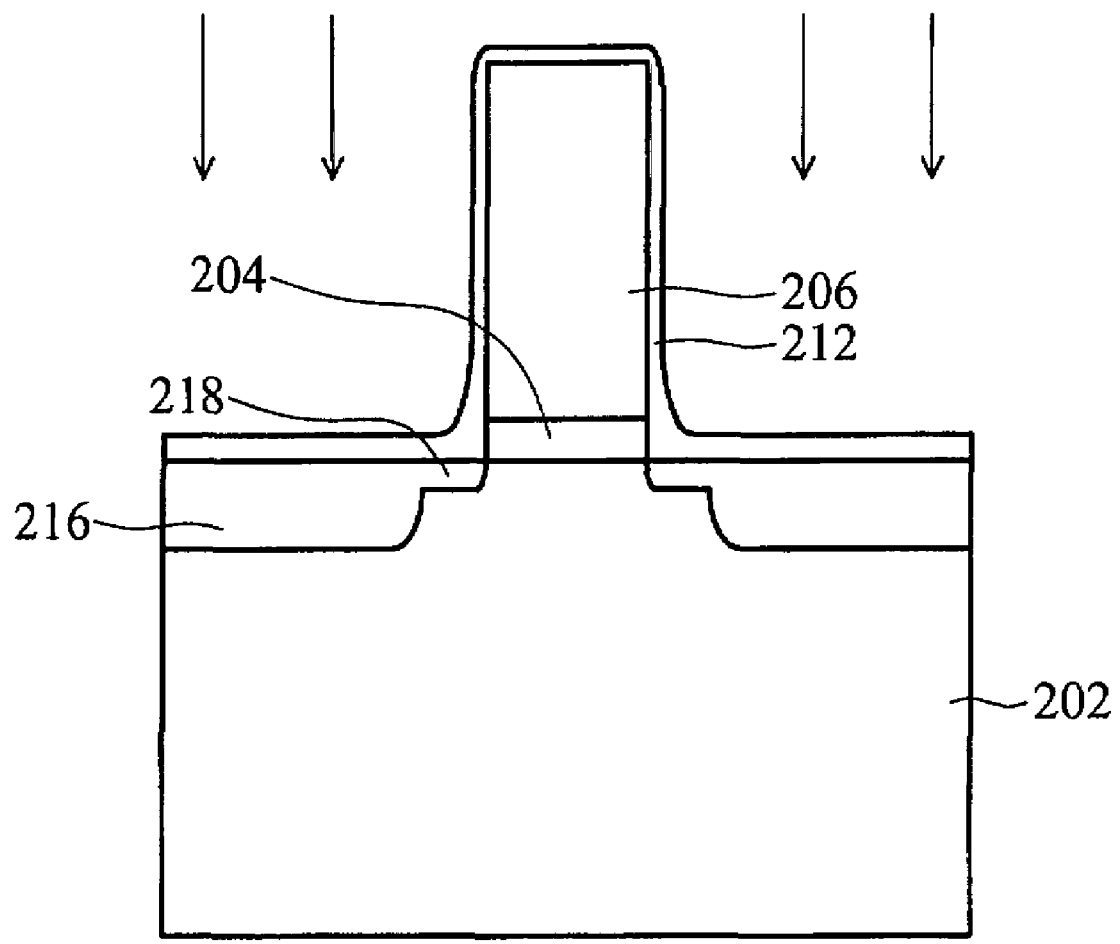

First, referring to FIG. 2A, a gate dielectric layer 204, a gate electrode layer 206 and a hard mask layer 208 are sequentially formed on a silicon substrate 202. A photoresist layer (not shown) is formed on the hard mask layer 208 and then patterned by lithography to form a photoresist pattern 220. Referring to FIG. 2B, the hard mask layer 208 is patterned using the photoresist pattern 220 as a mask, and the gate electrode layer 206 and the gate dielectric layer 204 are then patterned using the patterned hard mask layer 208 as a mask. Referring to FIG. 2C, a liner layer 210 and a nitride layer 212 are sequentially formed to cover the gate electrode layer 206, the gate dielectric layer 204 and the substrate 202. Next, referring to FIG. 2D, the nitride layer 210 is anisotropically etched to form a nitride spacer 214 adjacent a sidewall of the gate electrode layer 204. Referring to FIG. 2E, the substrate 202 is implanted using the nitride spacer 214 and the gate electrode layer 206 as a mask to form a source/drain region 216. Referring to FIG. 2F, the nitride spacer 214 is removed by plasma or wet stripping, and the substrate 202 is then further implanted using the nitride spacer 214 and the gate electrode layer 206 as a mask to form a lightly doped region 218. Removing the nitride spacer 214 by plasma or wet stripping, however, may result in diminished gate-ox reliability and junction leakage due to plasma damage and loss of silicon substrate 202 surface and other oxide formed element in fabrications of the semiconductor device.

FIGS. 3A-3I show an implementation of forming a transistor of an exemplary embodiment of invention. First, referring to FIG. 3A, a gate dielectric layer 302, a gate electrode layer 304 and a hard mask layer 306 are sequentially formed on a substrate 300. A photoresist layer (not shown) is formed on the hard mask layer 306 and then patterned by lithography to form a photoresist pattern 308. The substrate 300 may include an elementary semiconductor, such as crystal silicon, amorphous silicon, and/or germanium; a compound semiconductor, such as silicon carbide and/or gallium arsenic; an alloy semiconductor, such as SiGe, GaAsP, AlInAs, and/or GaInP. Further, the substrate 300 may include a bulk semiconductor, such as bulk silicon, and such a bulk semiconductor may include an epi silicon layer. It may also or alternatively include a semiconductor-on-insulator substrate, such as silicon-on-insulator (SOI) substrate, or a thin-film-transistor substrate 300. The substrate 300 may also or alternatively include a multiple silicon structure or a multilayer compound semiconductor structure.

The gate dielectric layer 302 may be formed by any process known in the art, for example, a thermal oxidation, nitridation, sputter deposition, chemical vapor deposition, or a combination thereof. The gate dielectric layer 302 may include silicon oxide, silicon nitride, nitrided silicon oxide, silicon oxynitride, and high-K (for example, a K>8) dielectrics. The high-K dielectrics may include metal oxides, metal silicates, metal nitrides, transition metal-oxides, transition metal silicates, metal aluminates, and transition metal nitrides, or combinations thereof. For example, the high-K dielectrics may include, but are not limited to, one or more of aluminum oxide ($Al_2O_3$), hafnium oxide ($HfO_2$), hafnium oxynitride (HfON), hafnium silicate ($HfSiO_4$), zirconium oxide ($ZrO_2$), zirconium oxynitride (ZrON), zirconium silicate ($ZrSiO_2$), yttrium oxide ($Y_2O_3$), lanthanum oxide ($La_2O_3$), cerium oxide ($CeO_2$), titanium oxide ($TiO_2$), tantalum oxide ($Ta_2O_5$), or combinations thereof. Preferably, the gate dielectric layer 302 is silicon oxide, and the gate electrode layer 304 comprises doped poly silicon and/or metal. The gate electrode layer 304 of the gate structure 300 is preferably formed of polysilicon, and may include doped or undoped polysilicon, amorphous polysilicon, and polysilicon-germanium, or combinations thereof. The hardmask layer may 306 be formed of at least one of silicon nitride (for example, a SiN), silicon oxynitride (for example, a SiON), and silicon oxide (for example, a $SiO_2$), preferably having an uppermost layer of SiON to act as an anti-reflective coating (ARC) in the resist patterning process. The hard mask layer 306 is typically etched with a fluorocarbon and/or hydrofluorocarbon etching chemistry with high etching selectivity with respect to gate electrode materials, for example, polysilicon.

Figure 3A:
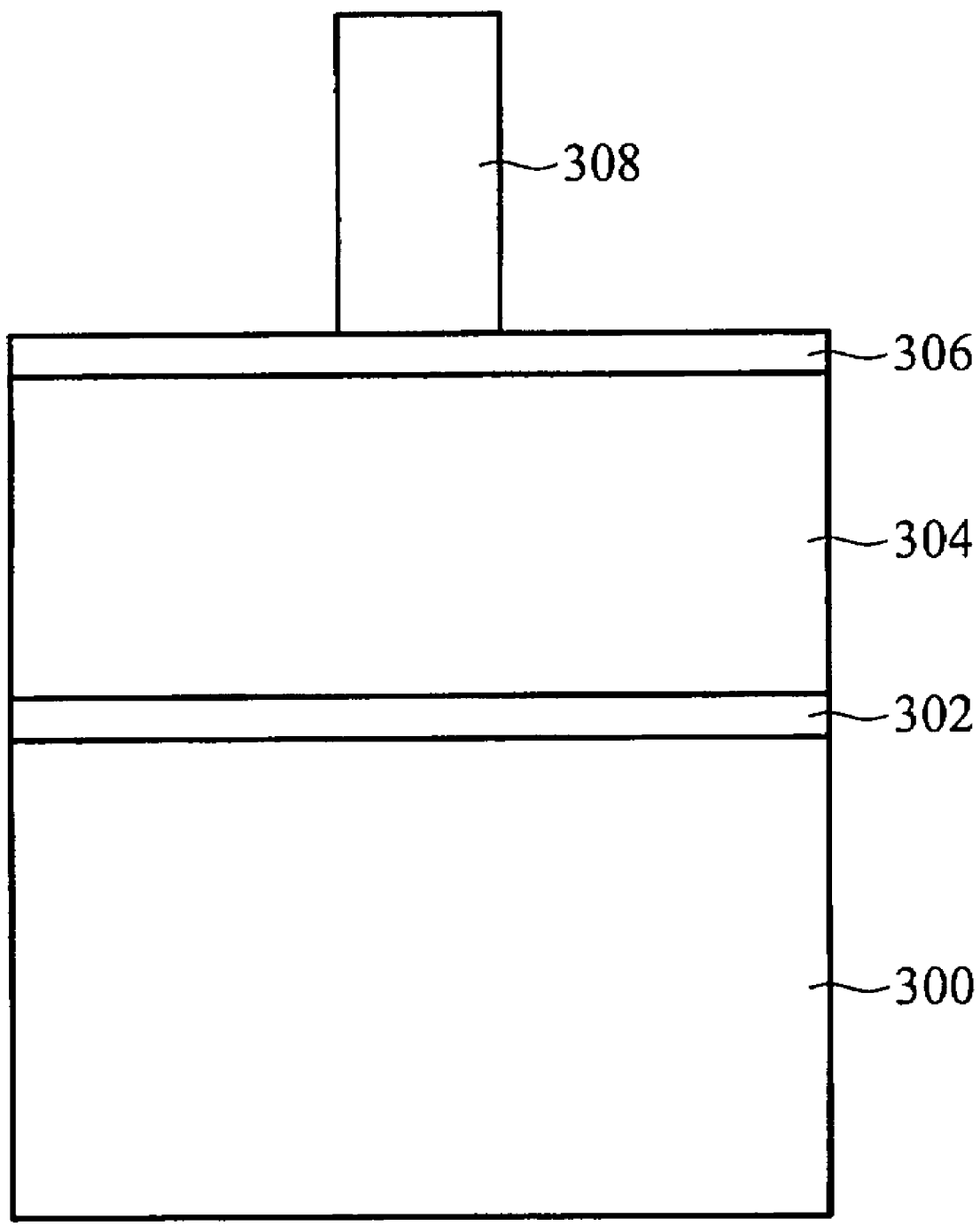
FIGS. 3A-3I are cross sectional views of a portion of a transistor showing integrated circuit manufacturing stages according to an exemplary embodiment of the invention.
Figure 3B:
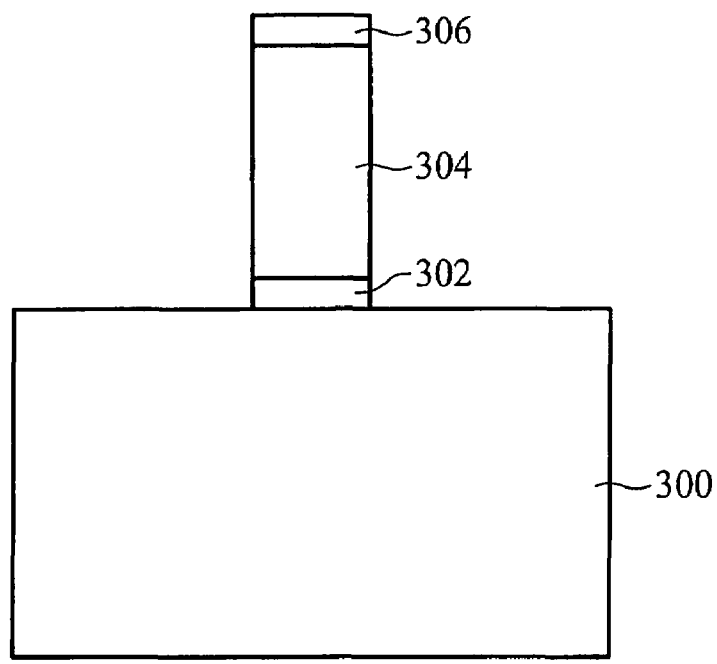

Referring to FIG. 3B, the hard mask layer 306 is patterned using the photoresist pattern 308 as a mask, and the gate electrode layer 304 and the gate dielectric layer 302 are then patterned using the patterned hard mask layer 306 as a mask. For example, a dry etching chemical for patterning the polysilicon gate electrode layer 304 includes $Cl_2$, HBr, $O_2$, and He, which has good selectivity to gate dielectric material, for example, silicon oxide. Subsequent to etching of the polysilicon to form the gate electrode layer 304, the hard mask layer 306 is removed, preferably by a selective wet etching process, such as, hot $H_3PO_4$.

Figure 3C:
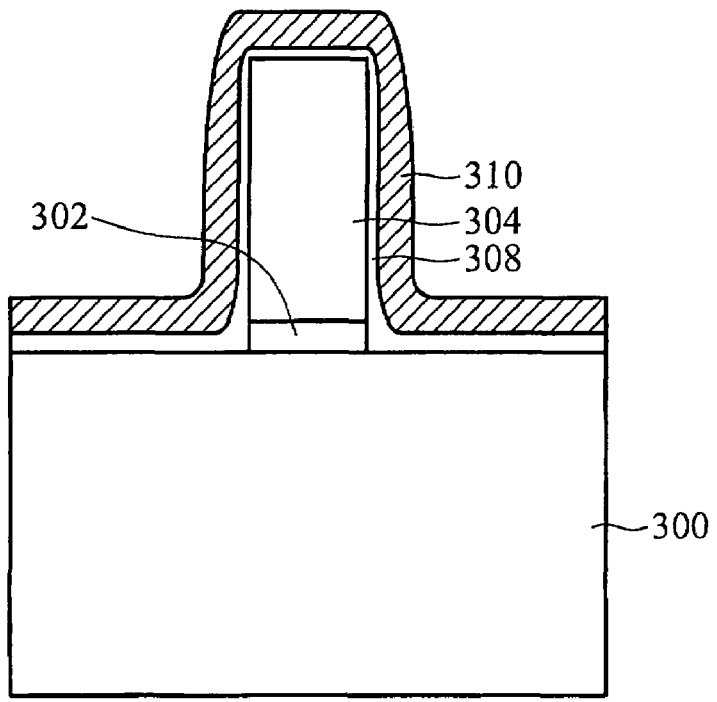

Referring to FIG. 3C, a liner layer 308 is then blanket deposited on the gate electrode layer 304 and the substrate 300. The liner layer 308 is preferably formed by a CVD process, for example a PECVD or LPCVD process, with a thickness of about 50 Å to 200 Å. The PECVD or LPCVD for forming liner layer 308 may be based on tetraethylorthosilicate (TEOS) precursor and oxygen, preferably ozone ($O_3$) or an $O_2/O_3$ mixture. It will be appreciated that other types of CVD silicon oxide precursors may be used, for example, a silane.

Still referring to FIG. 3C, in an important aspect of the invention, a carbon layer 310 is then blanket deposited by a CVD process on the liner layer 308 to a thickness of preferably between about 100 Å and about 500 Å. The carbon layer 310 is preferably amorphous carbon layer 310, which can be formed by LPCVD or PECVD in the same deposition chamber used for depositing the liner layer 308 at a temperature preferably between 300° C. to 400° C.

Figure 3D:
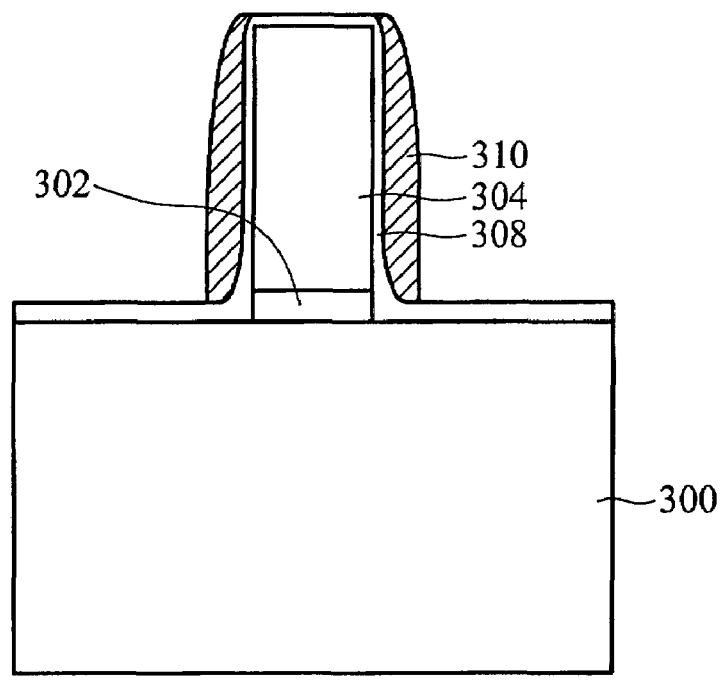

Referring to FIG. 3D, the carbon layer 310 is subjected to a selective (for example, a selective with respect to silicon oxide liner layer) dry etch back process using a fluorocarbon and/or hydrofluorocarbon containing dry etching chemical. The carbon layer 310 is etched back to stop on the liner layer 308 to form a carbon spacer 310. The carbon dry etching process preferably has a selectivity greater than about 10, more preferably greater than about 15 with respect to silicon oxide liner layer 308, thereby resulting in substantially no change in the oxide liner layer 308 used to subsequently form offset spacers to position an LDD implant as described in the following.

Figure 3E:
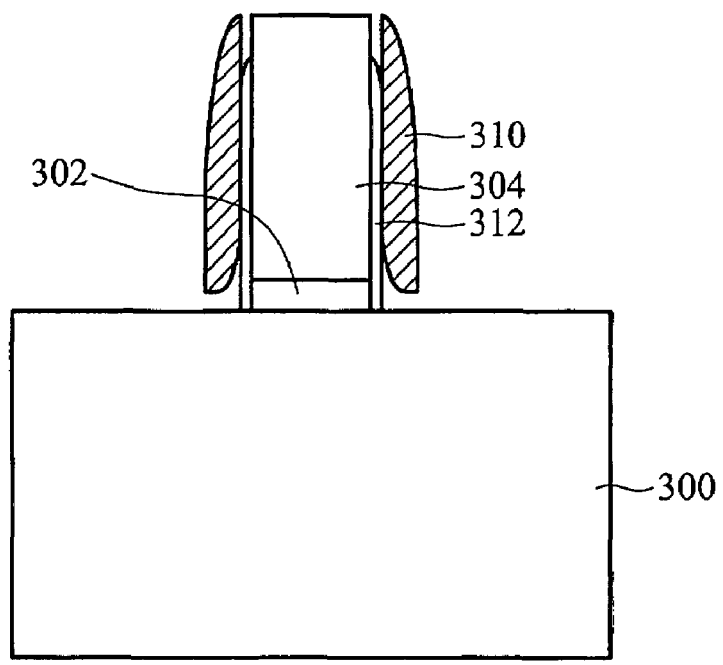
Figure 3F:
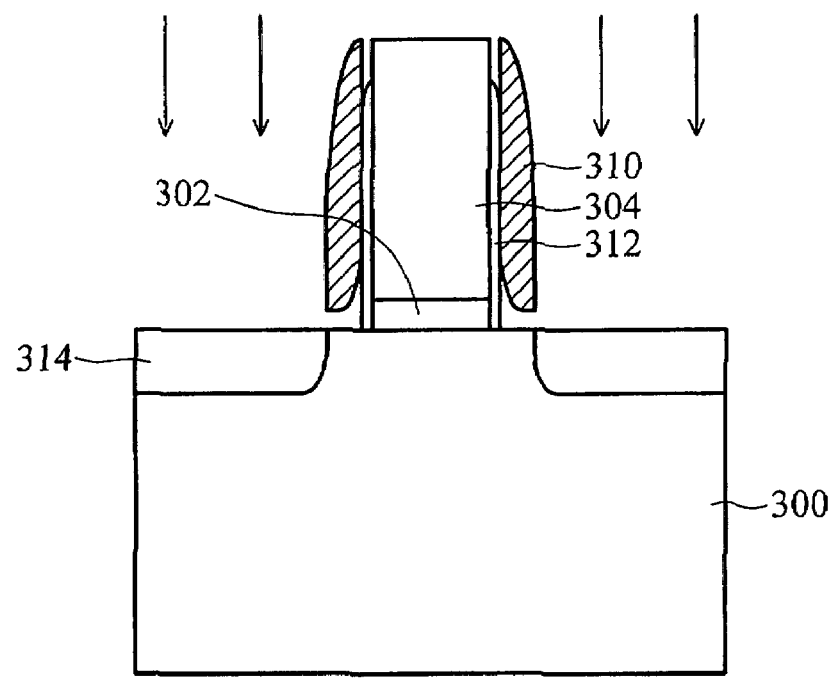

Referring to FIG. 3E, a oxide wet etching process, for example, an oxide dip in diluted HF (for example, 100 parts water to 1 part 50% HF) is carried out to remove portions of liner layer 308 overlying the substrate 300, the gate electrode 304, and portions underlying the carbon spacers 310 to form an offset spacer 312. Referring to FIG. 3F, a source and drain (S/D) ion implant and activation (annealing) process is then carried out to form a source/drain regions 314 in the semiconductor substrate 300, aligned with the outer edge of the carbon spacer 310.

Figure 3G:
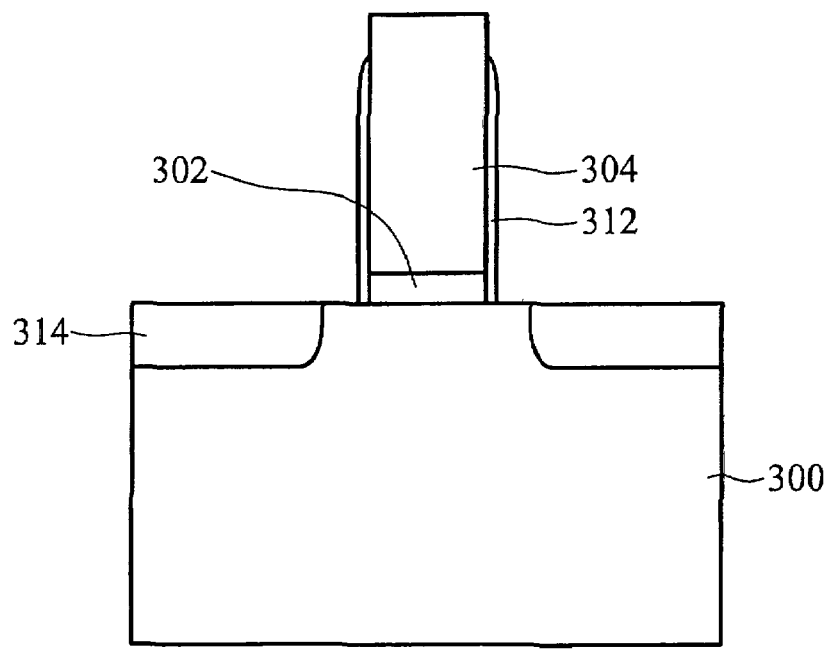
Figure 3H:
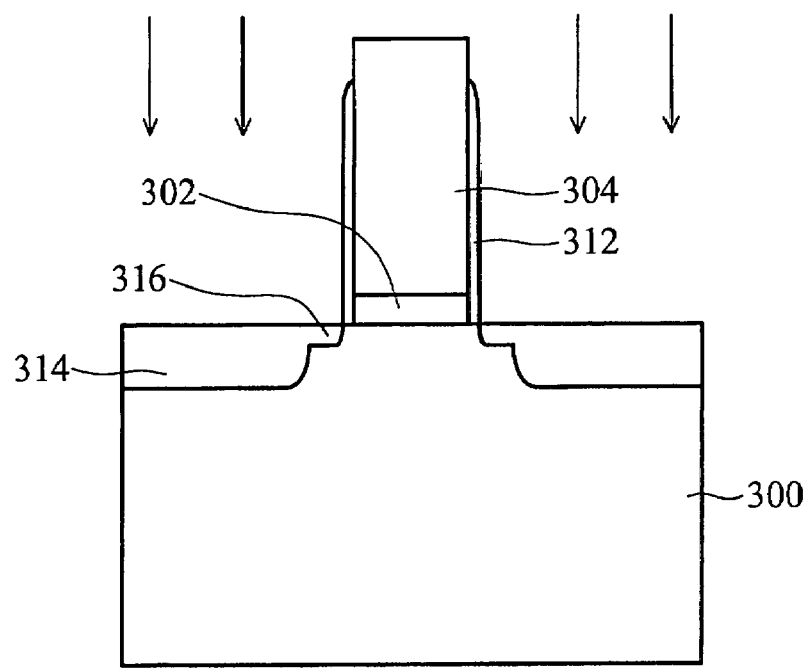

Referring to FIG. 3G, in an important aspect of the invention, the carbon spacer 310 is removed, preferably according to an ashing process, more preferably a dry ashing chemistry including at least $O_2$, and $H_2$. Advantageously, the ashing process is the same as the ashing process for removing photoresist resulting in substantially no damage or material loss of semiconductor substrate 300, gate dielectric layer 302, gate electrode layer 304 and/or oxide offset spacer 312. Referring to FIG. 3H, a conventional LDD ion implantation process is then carried out to form a lightly doped region 316 (for example, a about 50 Å to 200 Å thick), which are aligned with respect to the outer edge of the offset spacer 312. Advantageously, the LDD region 316 is predictably and reliably positioned using the thickness of liner layer 308 as offset spacer 312. Because the LDD implant is performed after S/D heavy implantation and annealing lateral diffusion of the LDD implanted dopants is reduced and material loss and/or plasma etching damage is substantially eliminated.

Figure 3I:
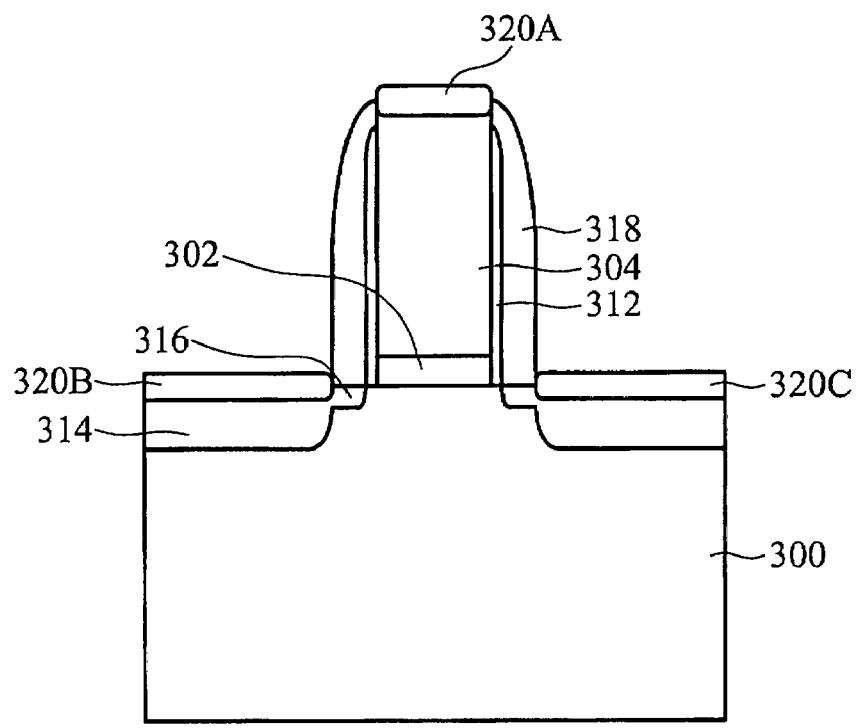

Referring to FIG. 3I, a main spacer 318 is formed by depositing a layer of silicon oxide, for example, a CVD silicon oxide to a thickness of about 300 to about 400 Å, and then carrying out a dry etching process. The main spacer 318 preferably has a width extending up to about the inner edge of the previously formed source/drain regions 314. A metal silicide formation process is then carried out to form self-aligned silicides (salicides) 320A, 320B and 320C over the source/drain regions 314 and optionally over the uppermost portion of the gate electrode layer 304. For example, the salicides 320A, 320B and 320C may be formed of $TiSi_2$, $CoSi_2$, or NiSi.

Figure 4A:
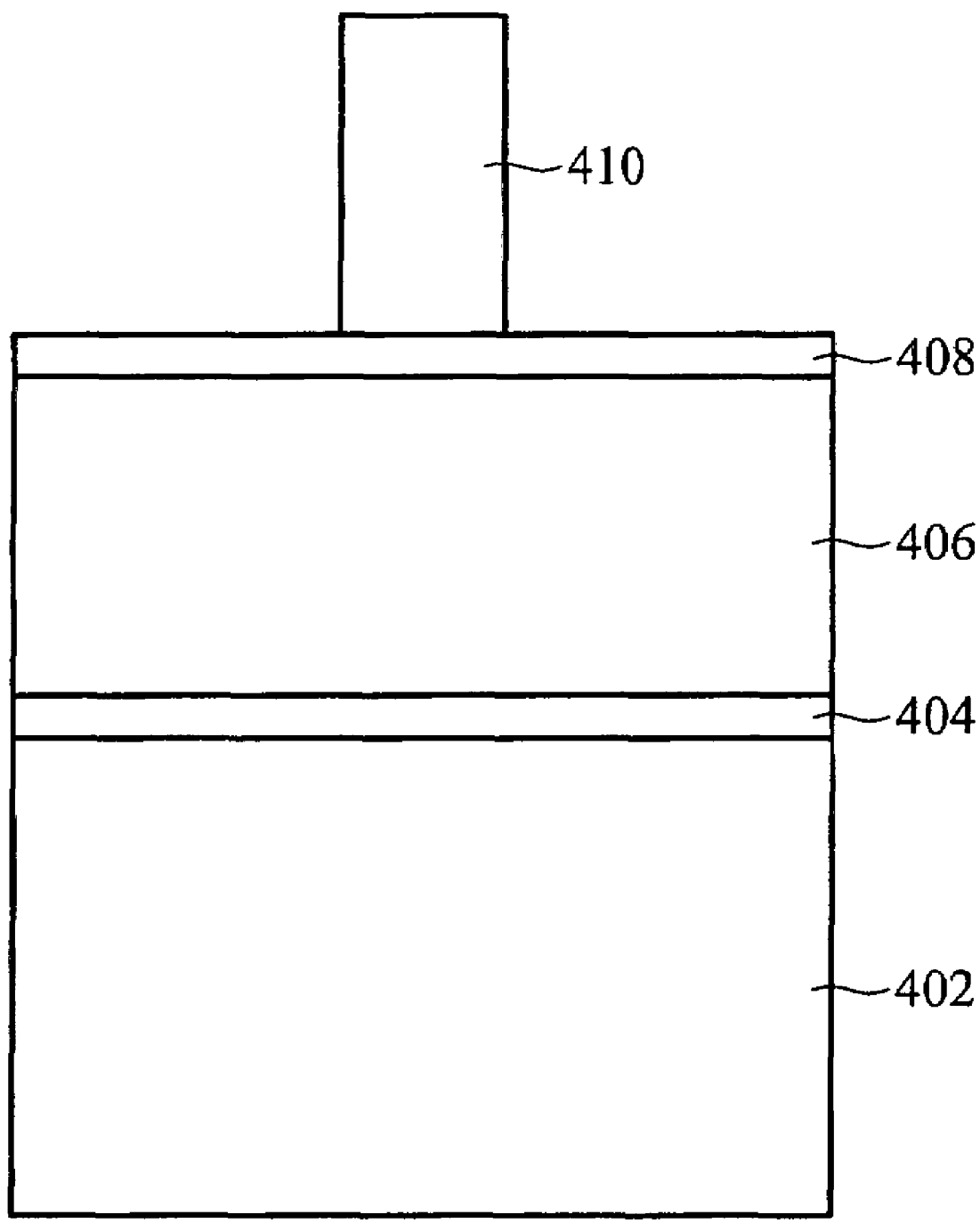
FIGS. 4A-4I are cross sectional views of a portion of a transistor showing integrated circuit manufacturing stages according to another exemplary embodiment of the invention.

FIG. 4A-FIG. 4I show another implementation of forming a transistor of an exemplary embodiment of invention. Referring to FIG. 4A, a gate dielectric layer 404, a gate electrode layer 406 and a hard mask layer 408 are sequentially formed on a substrate 402. A photoresist layer (not shown) is formed on the hard mask layer 408 and then patterned by lithography to form a photoresist pattern 410. The substrate 402 may include an elementary semiconductor, such as crystal silicon, amorphous silicon, and/or germanium; a compound semiconductor, such as silicon carbide and/or gallium arsenic; an alloy semiconductor, such as SiGe, GaAsP, AlInAs, and/or GaInP. The substrate 402 may further include a bulk semiconductor, such as bulk silicon. The bulk semiconductor may include an epi-silicon layer. The substrate 402 may also or alternatively include a semiconductor-on-insulator substrate, such as silicon-on-insulator (SOI) substrate, or a thin-film-transistor substrate. The substrate 402 may also or alternatively include a multiple silicon structure or a multilayer compound semiconductor structure.

The gate dielectric layer 404 may be formed by any process known in the art, for example, a thermal oxidation, nitridation, sputter deposition, chemical vapor deposition, or a combination thereof. The gate dielectric layer 404 may include silicon oxide, silicon nitride, nitrided silicon oxide, silicon oxynitride, and high-K (for example, a K>8) dielectrics. The high-K dielectrics may include metal oxides, metal silicates, metal nitrides, transition metal-oxides, transition metal silicates, metal aluminates, and transition metal nitrides, or combinations thereof. Preferably, the gate dielectric layer 404 is silicon oxide, and the gate electrode layer 406 comprises doped poly silicon and/or metal. The gate electrode layer 406 of the gate structure is preferably formed of polysilicon, and may include doped or undoped polysilicon, amorphous polysilicon, and polysilicon-germanium, or combinations thereof. The hardmask layer 408 may be formed of at least one of silicon nitride (e.g., SiN), silicon oxynitride (e.g., SiON), and silicon oxide (e.g., SiO2), preferably having an uppermost layer of SiON to act as an anti-reflective coating (ARC) in the resist patterning process. The hard mask layer 408 is etched typically with a fluorocarbon and/or hydrofluorocarbon etching chemistry with high etching selectivity with respect to gate electrode materials, for example, polysilicon.

Figure 4B:
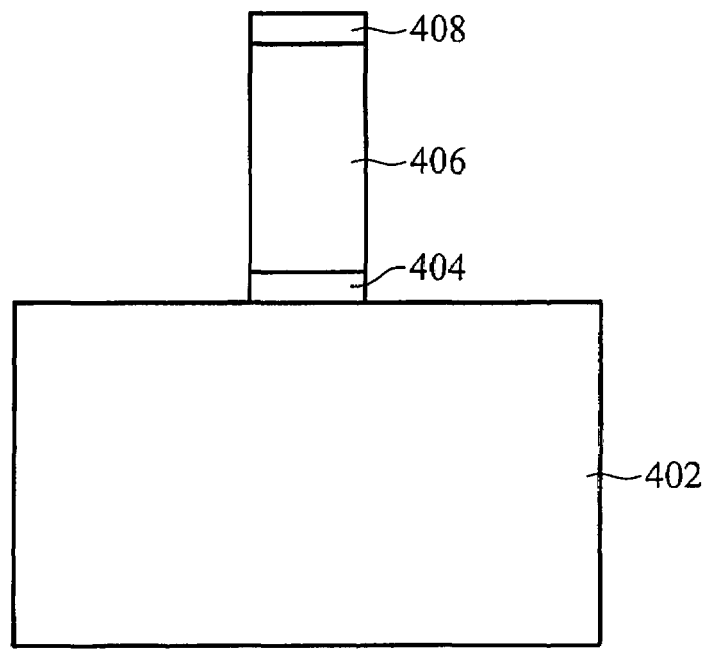

Referring to FIG. 4B, the hard mask layer 408 is patterned using the photoresist pattern 410 as a mask. The gate electrode layer 406 and the gate dielectric layer 404 are then patterned using the patterned hard mask layer 408 as a mask. A dry etching chemical for patterning the polysilicon gate electrode layer 406 may include, for example, $Cl_2$, HBr, $O_2$, and He, which has good selectivity to gate dielectric material, such as, silicon oxide.

Figure 4C:
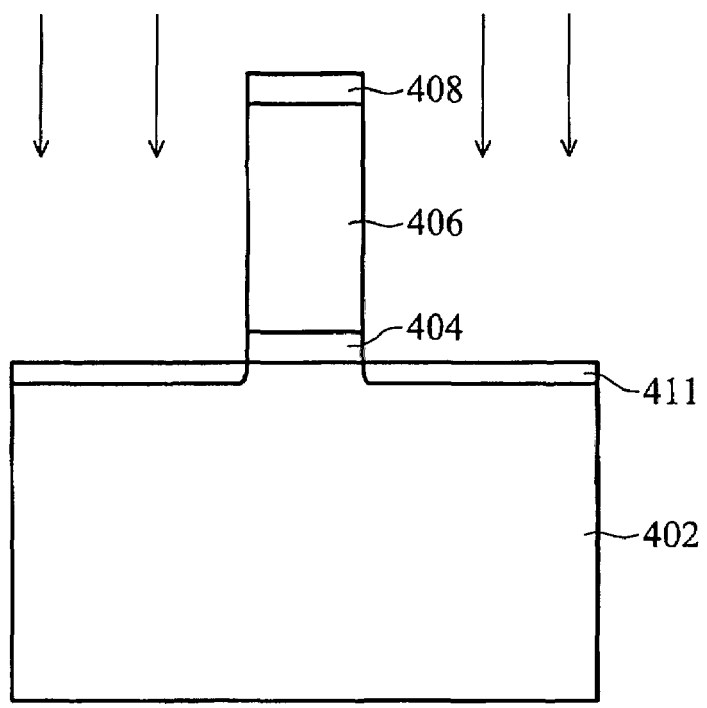
Figure 4D:
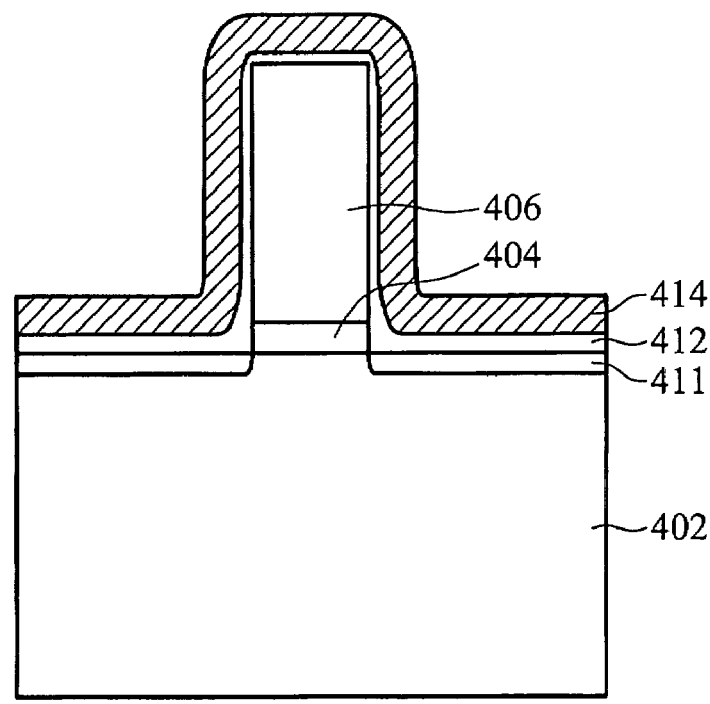
Figure 4E:
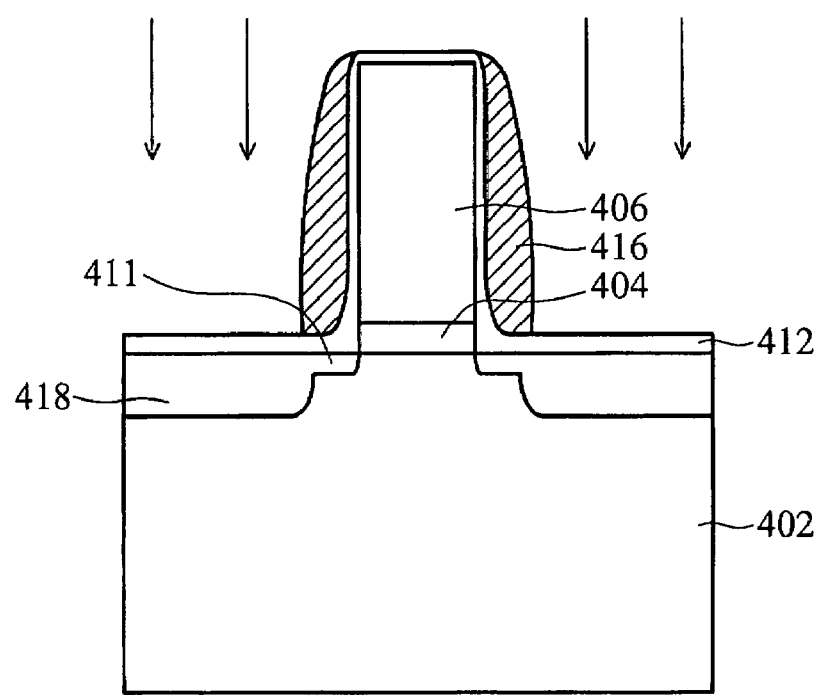

Next, referring to FIG. 4C, the substrate 402 is implanted using the hard mask layer 408 and the gate electrode layer 406 as a mask to form a lightly doped region 411. Referring to FIG. 4D, following formation of the lightly doped region 411, the hard mask layer 408 is preferably removed by a selective wet etching process for example, a hot $H_3PO_4$. Thereafter, a liner layer 412 and a carbon layer 414 are sequentially formed on the gate electrode layer 406 and the substrate 402. Referring to FIG. 4E, the carbon layer 414 is anisotropically etched to form a carbon spacer 416 adjacent a sidewall of the gate electrode layer 406, and the substrate 402 is then implanted and activated to form a source/drain region 418. Thus, an edge of the source/drain region 418 is substantially aligned with a sidewall of the carbon spacer 416. Preferably, the carbon spacer 416 comprises amorphous carbon.

Figure 4F:
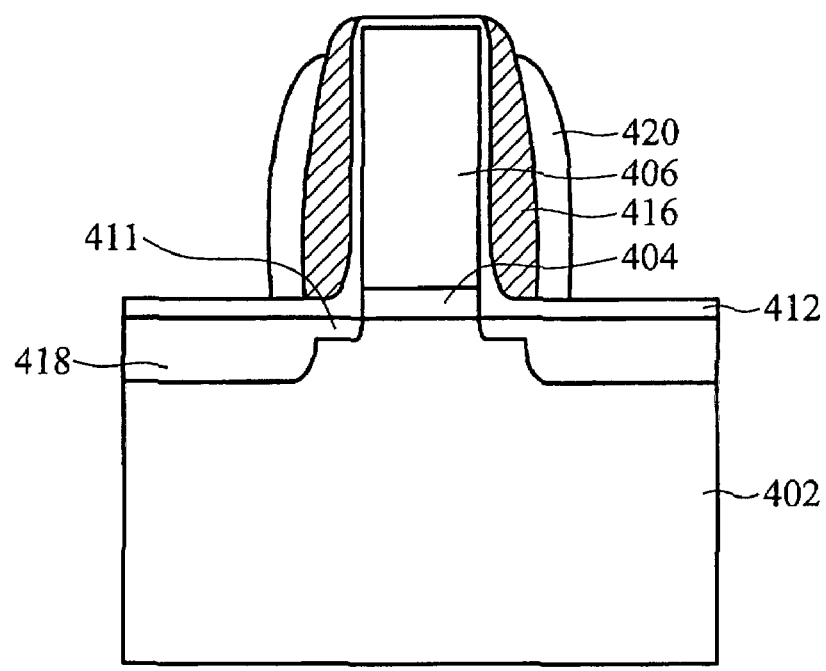

Referring to FIG. 4F, subsequent to a dry etchback process a main spacer 420 is formed by deposition adjacent the carbon spacer 416. The main spacer 420 preferably comprises silicon nitride and/or silicon oxynitride and has a thickness of about 200 Å to 300 Å. Preferably, the top of the main spacer 420 is below the carbon spacer 416 to expose an upper portion of the carbon spacer 416.

Figure 4G:
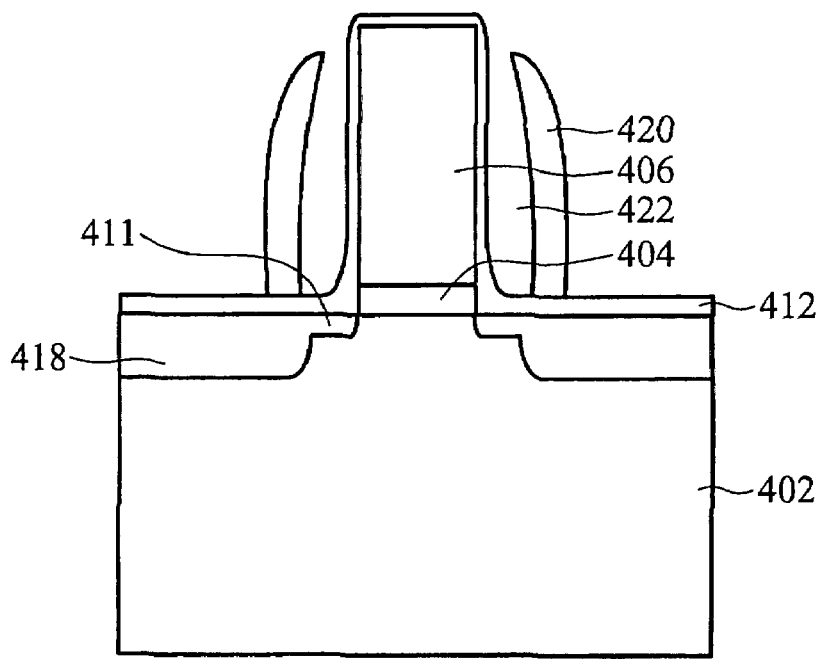

Referring to FIG. 4G, the carbon spacer 416 is removed to form an opening 422 between the liner layer 412 and the main spacer 420 according to the same ashing process as previously described. It will be appreciated that in the ashing process, a bias power, of for example, 50 to 300 Watts, may be applied to facilitate more efficient removal of the carbon spacer 416 from the inside of the opening 422.

Figure 4H:
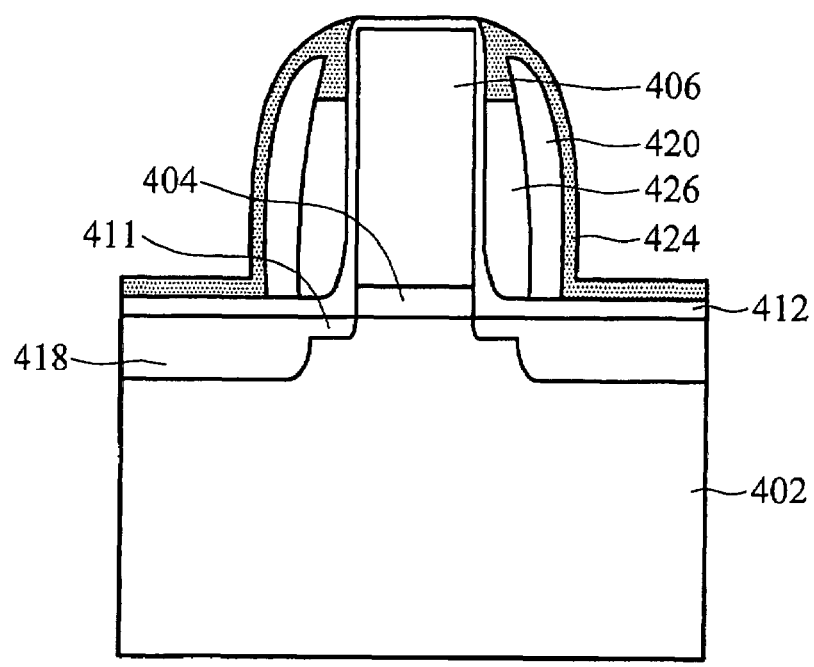

Referring to FIG. 4H, a sealing layer 424, for example, a CVD TEOS oxide, is blanket deposited for sealing the upper portion of the opening 422 to form an air gap 426. The thickness of the sealing layer 424 is preferably about the same as the width of the air gap 426 in the upper air gap 426 portions, for example, from about 300 Å to 400 Å to ensure the air gaps 426 remain sealed after a subsequent oxide etchback process.

Figure 4I:
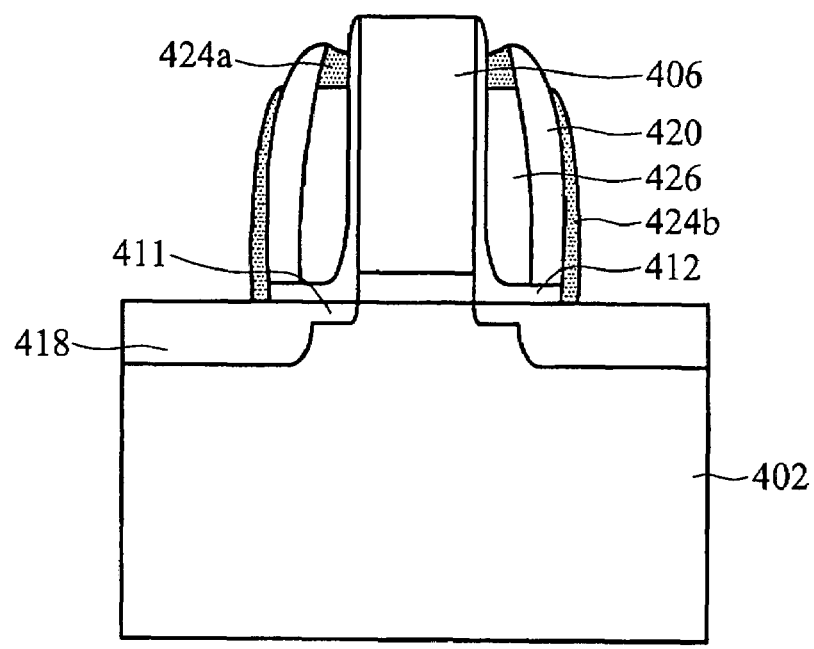

Referring to FIG. 4I, an oxide etchback process, preferably a dry oxide etchback process is then carried out to form an outer spacer 424B, while leaving the upper portion of the air gap 426 sealed with oxide and exposing the upper portion of the gate electrode layer 406. A metal silicide (salicide) formation process may then be carried out as to form a metal silicide region as previously described. As the gate structure of the embodiment of the invention as shown in FIG. 4I, the air gap 426 is surrounded by the liner layer 412, the main spacer 420 and a sealing layer 424a. Additionally, the top of the main spacer 420 is below the surface of the gate electrode layer 406, and the thickness of the sealing layer 424a is substantially the same as width of the air gap 426.

The air gap 426 serves to advantageously and significantly reduce the capacitance between the gate electrode 406 and adjacent metal plug in the contact (not shown) to drain for improving device performance. Thus, a method of forming and removing readily removable (disposable) carbon spacer 416 without material loss or damage to active areas has been presented. In the first embodiment, disposable carbon spacer 416 is formed to control SCE by forming and activating the source/drain region prior to removing the amorphous carbon spacers, followed by forming the LDD region thereby reducing LDD lateral diffusion. The advantages of the invention may include more precise aligning of the LDD implant by avoiding oxide loss in the carbon spacer removal process and avoiding material loss and damage to the substrate and polysilicon electrode. Additionally, the process flow is easily extended to a subsequent salicide formation process. Alternatively in the second embodiment, the carbon spacer may be removed following formation of a set of the main spacer to form an air gap with minimal material loss, damage, and contamination, thereby reducing gate to drain capacitance to improve device performance.

While the invention has been described by way of example and in terms of the preferred embodiments, it is to be understood that the invention is not limited to the disclosed embodiments. To the contrary, it is intended to cover various modifications and similar arrangements (as would be apparent to those skilled in the art). Therefore, the scope of the appended claims should be accorded the broadest interpretation so as to encompass all such modifications and similar arrangements.

What is claimed is:

1. A method for forming a semiconductor device, comprising:
    providing a substrate, comprising a gate dielectric layer and a gate electrode layer sequentially formed thereon;
    forming an offset spacer on sidewalls of the gate dielectric layer and the gate electrode layer, wherein the offset spacer is in direct contact with the gate dielectric layer and the gate electrode layer;
    forming a carbon-based spacer on a sidewall of the offset spacer, wherein the offset spacer does not extend under the carbon-based spacer;
    implanting the substrate to form a source/drain region using the gate electrode layer, the offset spacer and the carbon-based spacer as a mask;
    performing $H_2/O_2$ plasma ashing to remove the carbon-based spacer; and
    implanting the substrate to form a lightly doped region using the gate electrode layer and the offset spacer as a mask.

2. The method for forming a semiconductor device as claimed in claim 1, further comprising forming a main spacer on a sidewall of the offset spacer after implanting the substrate to form a lightly doped region.

3. The method for forming a semiconductor device as claimed in claim 2, further comprising carrying out a silicide formation process using the main spacer and the offset spacer as a mask.

4. The method for forming a semiconductor device as claimed in claim 1, wherein the carbon-based spacer comprises amorphous carbon.

5. The method for forming a semiconductor device as claimed in claim 1, the steps of forming the offset spacer comprises:
    forming a liner layer on sidewalls of the gate dielectric layer and the gate electrode layer and on the substrate surface; and
    wet etching the liner layer to remove a portion thereof, thus forming the offset spacer.

6. The method for forming a semiconductor device as claimed in claim 1, wherein the offset spacer comprises silicon oxide.

7. The method for forming a semiconductor device as claimed in claim 1, wherein etching selectivity between the carbon-based spacer and the offset spacer is substantially larger than 15.

8. The method for forming a semiconductor device as claimed in claim 1, wherein an edge of the lightly doped region is substantially aligned with the offset spacer.

9. The method for forming a semiconductor device as claimed in claim 1, wherein an edge of the source/drain region is substantially aligned with the carbon-based spacer.

* * * * *